(12) United States Patent
Yui et al.

(10) Patent No.: US 6,479,998 B1
(45) Date of Patent: Nov. 12, 2002

(54) ACTIVE SHIELD TYPE OF ELLIPTIC CYLINDER-SHAPED GRADIENT COIL FOR MAGNETIC RESONANCE IMAGING

(75) Inventors: Masao Yui, Otawara (JP); Yoshitomo Sakakura, Nasa-Gun (JP)

(73) Assignee: Kabushiki Kaisha Toshiba, Kanagawa-Ken (JP)

( * ) Notice: Subject to any disclaimer, the term of this patent is extended or adjusted under 35 U.S.C. 154(b) by 0 days.

(21) Appl. No.: 09/863,007

(22) Filed: May 23, 2001

(30) Foreign Application Priority Data

May 23, 2000 (JP) ........................................ 2000-151956

(51) Int. Cl.$^7$ ................................................. G01V 3/00
(52) U.S. Cl. ........................................ 324/318; 324/322
(58) Field of Search ................................ 324/318, 322, 324/300, 312, 314, 306, 307, 309

(56) References Cited

U.S. PATENT DOCUMENTS

| 5,177,441 A | | 1/1993 | Morich et al. | |
| 5,266,913 A | * | 11/1993 | Chapman | 324/307 |
| 5,574,373 A | * | 11/1996 | Pausch et al. | 324/318 |

FOREIGN PATENT DOCUMENTS

| JP | 2000-232968 | 8/2000 |

OTHER PUBLICATIONS

Q. Liu et al.: "General expressions for the Magnetic Field and Stored Energy of Elliptic Cylinder Coils" Journal of Magnetic Resonance, Series B113, pp. 222–227 (1996).

Q Liu et al.; "Improved, Minimum–Inductance, EllipticCylinder z–Gradient Coil Using Axial and Azimuthal Current Flow" Journal of Magnetic Resonance, Series B113, pp. 228–235 (1996).

* cited by examiner

Primary Examiner—Louis Arana
(74) Attorney, Agent, or Firm—Nixon & Vanderhye P.C.

(57) ABSTRACT

A gradient coil for magnetic resonance imaging (MRI) ha an elliptic cylindrical first coil and a second coil arranged coaxially to the first coil. The second coil is located outside the first coil in the radial direction thereof. The second coil is either elliptic-cylindrical or cylindrical winding positions of wires of the second coil are determined so that a magnetic field created outside the second coil by the first coil is cancelled out. Practically, circumferential current densities of the first and second coils are expressed by weighted even and odd functions. Ratios between weights of the second and first coils are then determined on values derived from the number of waves in the coil axial direction and a flatness rate of the ellipse. The winding positions of wires of the second coil are determined on the values.

9 Claims, 8 Drawing Sheets

SYMMETRIC TYPE

FIG. 5A      FIG. 5B

ASYMMETRIC TYPE

ACTIVE SHIELD TYPE OF ELLIPTIC CYLINDER-SHAPED GRADIENT COIL FOR MAGNETIC RESONANCE IMAGING

BACKGROUND OF THE INVENTION

1. Technical field

The present invention relates to a gradient coil incorporated in a magnetic resonance imaging system in order to give magnetic field gradients to an examination space formed in a bore of the system, and in particular, to an active shield type of elliptic cylindrical gradient coil.

2. Related Art

A medical MRI system uses a magnetic resonance phenomenon of nuclear spins within an object to acquire tomographic images or measure NMR spectrums.

The MRI system has a gantry that has an examination space formed, for example, in a substantially cylindrical shape, into which an object to be examined is inserted. The gantry has a static magnet, which forms the examination space, for generating a magnetic static field, a gradient coil for generating magnetic field gradient pulses superposed on the static field, and an RF coil for transmitting and receiving RF pulse signals (including MR signals) to and from the object.

A gradient amplifier, which is coupled with the gradient coil, is driven in response to instructions given from a sequencer to the gradient amplifier, so that the gradient coil creates magnetic field gradient pulses. Currently, it is required that the magnetic field gradient pulses be switched at a switching time of less than 1 msec. Especially, in the case of ultra-fast imaging techniques that have drawn much attention, a switching time of less than 0.3 msec. is required. To realize this, it has been desired that a gradient coil assembly of higher energy efficiency be developed, together with a high-power gradient amplifier.

Conventionally, for MRI systems in which the magnetic static field is directed horizontally, cylindrical gradient coil assemblies have been used. A first measure to increase the energy efficiency of this cylindrical gradient coil assembly is to reduce the coil radius. This is based on the fact that inductance, which is a parameter in determining the switching time of a coil, is proportional to the coil radius to $5^{th}$ power. However, this technique requires that the coil radius be reduced with an increase in energy efficiency. It was therefore difficult to obtain a radius of the examination space that permits whole-body imaging for adults.

One solution to this problem is proposed for example by U.S. Pat. No. 4,820,988. This publication discloses a gradient coil assembly in which coils are formed into an elliptic cylinder in place of a cylinder. The coil radius is shortened in the vertical direction (normally, in the Y-axis direction) in such a manner that a section perpendicular to the axis through the coils is formed into an elliptic shape. This makes a higher rate of energy efficiency possible and the whole-body examination for adults can be performed. Practically, disclosed coil shapes include a coil shape in which a half cylinder is decentered in the Y-axis direction and placed face to face and a second coil shape in which a cylindrical coil is flattened in a certain direction to the surface so as to form an elliptic cylindrical gradient coil.

An alternative measure is proposed by Japanese Patent Laid-open 5-269100, which discloses an elliptic gradient coil assembly formed into an elliptical cylindrical coil and a detailed design method of such coil assembly.

One significant management item for the gradient coil assembly is to suppress eddy current that occurs in pulsating the assembly to a lower value of current. The eddy current occurs in transition manners when a time-dependent magnetic field penetrates a thermal shielding plate of the static magnet, thereby causing a magnetic eddy field in a region necessary for imaging. This causes irregularities in intensity of an MR image, deeply deteriorating image quality. To prevent this problem, an active (self-) shielded type of gradient coil assembly (ASGC: Actively Shielded Gradient Coil) is used, as shown in for example U.S. Pat. No. 4,733, 189 and U.S. Pat. No. 4,737,716. In such coils, a shield coil is placed outside the gradient coil assembly to suppress or shield a magnetic field leaking out of the gradient coil serving as a main coil. The ASGC has coil assemblies in charge of generating magnetic fields in the individual X-, Y- and Z-channels of an MRI system, and each coil assembly is equipped with a main coil and a shield coil. This shield structure almost prevents, channel by channel, magnetic field gradients from leaking out.

Practical design techniques for an ASGC of which coils are formed into a cylindrical shape are proposed by Mansfield et al., "J. Phys. E: Sci. Inst. 19, 540–545 (1986)," Turner et al., "J. Phys. D: Appl. Phys. Vo.19, L147–L151," and others.

Thus, an elliptic cylindrical gradient coil should be an actively shielded type of coil. To meet this demand requires a design technique that permits magnetic field gradients to be generated at a higher accuracy. However, such a practical way of designing the elliptic cylindrical gradient coil has yet to be proposed. There are therefore difficulties in designing an active shield type of elliptic cylindrical gradient coil in terms of computing the current distribution of shield coils and computing a desired magnetic performance (such as a maximum gradient strength and linearity in the magnetic field). The active shield type of elliptic cylindrical gradient coil has not been put into practical uses.

SUMMARY OF THE INVENTION

The present invention, which has been made with consideration of the above problems that the conventional techniques face, is directed to a detailed manner of designing an active shield type of elliptic cylindrical gradient coil, thereby permitting such a coil to be put into practical uses.

To realize this object, a gradient coil for magnetic resonance imaging (HRI) according to the present invention comprises a first coil forming an elliptic cylinder; and a second coil disposed coaxially to the first coil, wherein a coil wire of the second coil is positioned in winding so that a magnetic field created by the first coil outside the second coil is cancelled.

Preferably, current density in a circumferential direction of each of the first and second coils is expressed by weighted even functions and weighted odd functions, ratios between weights for the second coil and weights for the first coil are determined by values based on the number of waves in a coil-axis direction and a flatness rate of an ellipse, and wound positions of the coil wire of the second coil are determined based on the values.

More preferably, the second coil is located outside the first coil in a radial direction of the first coil. In this structure, the second coil is formed into an elliptic cylinder and an elliptic cylindrical plane formed by the second coil and an elliptic cylindrical plane formed by the first coil possess in common a focus located at almost the same position. By way of example, the second coil is formed into a cylinder.

According to these structures, there can be provided a way to design winding positions of an MRI gradient coil in which the elliptic-cylindrical or cylindrical second coil (shield coil) is disposed outside the elliptic cylindrical first coil (main coil) with the same center axis given. Thus, an active shield type of elliptic cylindrical gradient coil can be provided and put into a practical use, in which a higher rate of energy efficiency is kept, while still enabling whole-body imaging and surely suppressing eddy currents to reduce artifacts.

In addition, the present invention provides a magnetic resonance imaging system in which the above gradient coil is incorporated, a design technique for the gradient coil, and a computer-readable program preferable to the design.

DETAILED DESCRIPTION OF PREFERRED EMBODIMENTS

Referring to the accompanying drawings, preferred embodiments of the present invention will now be described.

First Embodiment

Referring to FIGS. 1 to 9, an MRI (magnetic resonance imaging) system according to a first embodiment will now be described.

Figure 1:
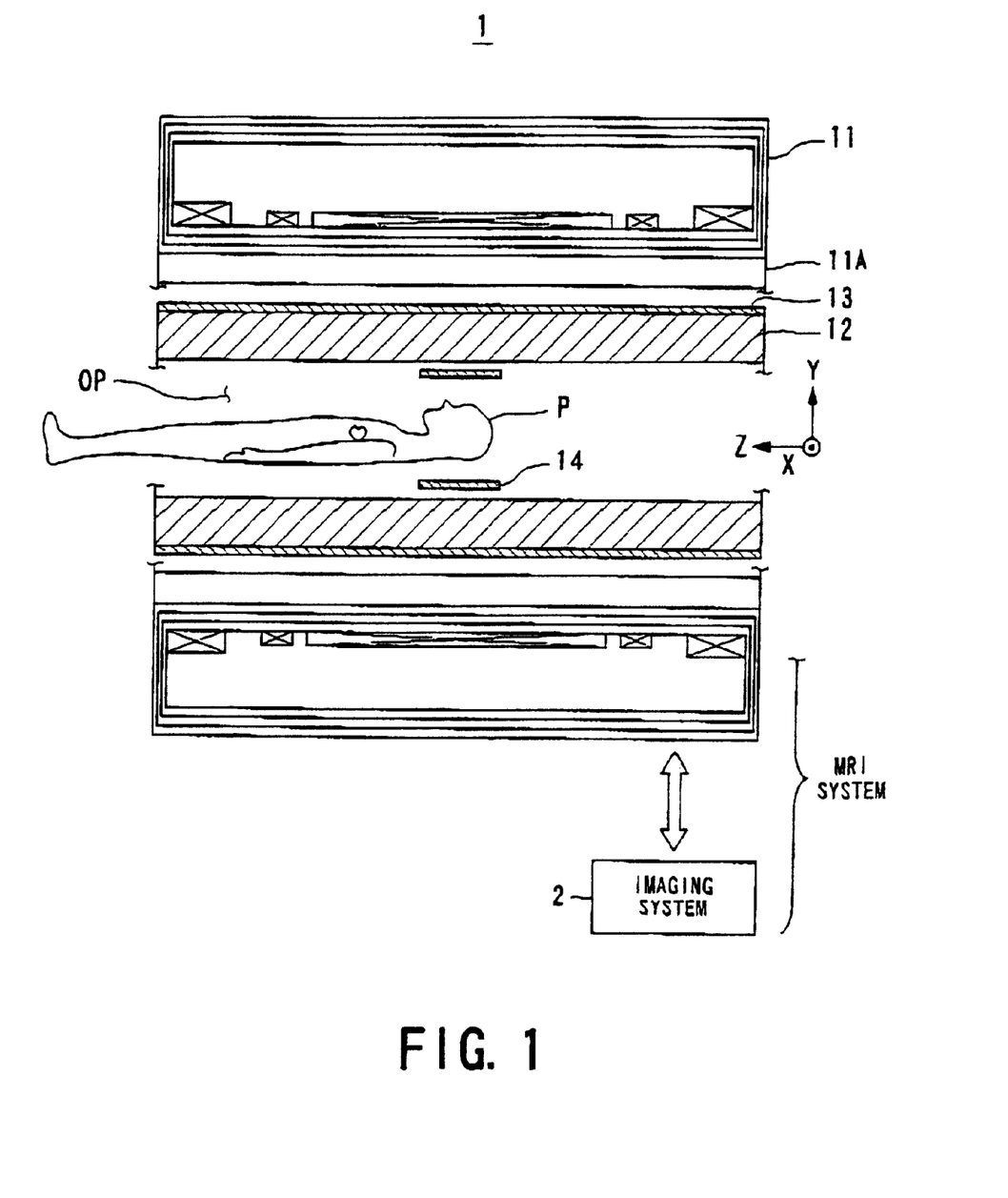
FIG. 1 is an outlined schematic view of a gantry of an MRI system according to embodiments of the present invention.

The MRI system has a gantry 1 and an imaging system 2. The gantry 1 is equipped with a gradient coil, which is made up of an active (self-) shield type of gradient coil (ASGC: Actively Shielded Gradient Coil) in which the section perpendicular to its axial direction is formed into an approximate ellipse. Hereafter, this gradient coil is referred to as an "elliptic cylindrical ASGC," in which the term "cylinder" is used as a hollow type of cylinder. The imaging system 2 applies an imaging pulse sequence, acquires an MR signal, reconstructs an MR image, memorizes MR data, and conducts an interface to/from a user.

FIG. 1 outlines a section along the axial direction of the gantry 1 of the MRI system. The whole gantry 1 is shaped into a cylinder in which the inner bore serves as an examination space OP, and into which an object to be examined P is placed during an examination. An orthogonal XYZ coordinate system is defined on condition that the axial direction of the gantry 1 is set to the Z-axis.

The gantry 1 is provided with a static magnet 11 shaped into an approximate cylinder actually providing the bore, an elliptic cylindrical ASGC (substantially cylindrical gradient coil) disposed within the bore of the magnet 11, a shim coil 13 attached for example on the outer surface of the elliptic cylindrical ASGC 12, and an RF coil 14 disposed within the bore of the elliptic cylindrical ASGC 12. With the RF coil 14 placed around the object, the object is laid on a tabletop (not shown) and placed in the bore (examination space).

The static magnet 11 is formed by a superconducting magnet that has an outer vacuum container in which a plurality of thermal-radiation shielded containers and a single liquid helium container are contained. Superconducting coils are wound and disposed within the liquid helium container. The outer vacuum container is covered on the outer surface by a metal casing 11A.

The elliptic cylindrical ASGC 12 has a coil assembly for each of the X-, Y-, and Z-channels and each coil assembly is made into a shield structure that resists the leakage of a magnetic field created by itself into an outer space thereof. With such shielded states for all the channels, pulsed magnetic gradients are generated in each of the X-, Y- and Z-axis directions.

Practically, the elliptic cylindrical ASGC 12 is formed as a structure in which an X-coil 12X, Y-coil 12Y and Z-coil 12Z of the X-, Y- and Z-channels are layered coil by coil with insulating members therebetween, thus a cylinder is formed in which a section is generally a substantial ellipse. Each of the X-coil 12X, Y-coil 12Y and Z-coil 12Z includes a main coil (corresponding to the first coil of the present invention) that has a plurality of winding parts creating a magnetic gradient in each of the X-, Y- and Z-axis directions and a shield coil (corresponding to the second coil of the present invention) that has a plurality of shielding winding parts to reduce or suppress the magnetic gradient (pulsed) created by the winding parts of the main coil from leaking out. Each of the coils 12X, 12Y and 12Z is connected to an individual gradient power supply channel by channel.

Figure 2:
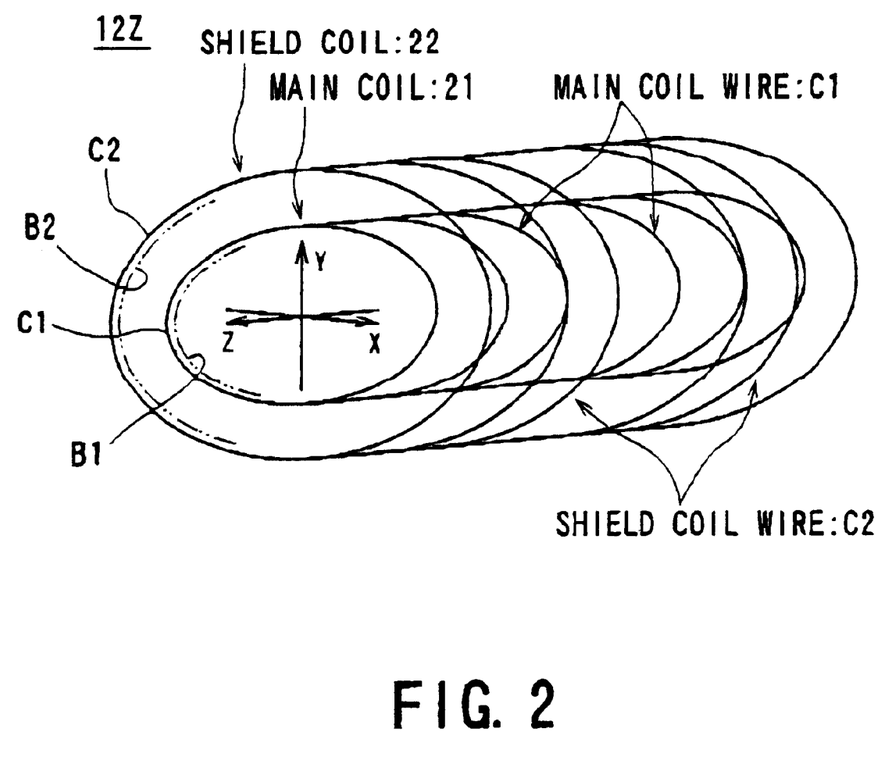
FIG. 2 is a conceptual view illustrating wire arrangement of a Z-coil included in an elliptic cylindrical ASGC according to a first embodiment.

FIG. 2 outlines a pictorial configuration of the Z-coil 12Z, which is a representative of the X-coil, Y-coil and Z-coil. A coordinate system is defined in the configuration such that the Z-axis is a center axis itself of the Z-coil 12Z and the X- and Y-axes are set as two mutually-perpendicular axes perpendicular to the Z-axis.

The Z-coil 12Z, as illustrated in FIG. 2, includes a main coil 21 serving as the first coil and a shield coil 22 serving as the second coil, both of which are formed in a coaxial elliptic cylinder of double-layered coils. Winding a coil wire C1 around a bobbin B1 (the first bobbin), which has an elliptical cross-section when viewed in the axial (Z-axis) direction, forms the main coil 21. The coil wire C1 is for example a flat conductor. On the other hand, winding a coil wire C2 around a bobbin B2 (the second bobbin) larger in diameter than the bobbin B1, which has an elliptical cross-section when viewed in the axial direction forms the shield coil 22. Current is supplied to both the main coil and the shield coil so that currents passing through the coil wires C1 and C2 are opposite to each other.

Figure 3A:
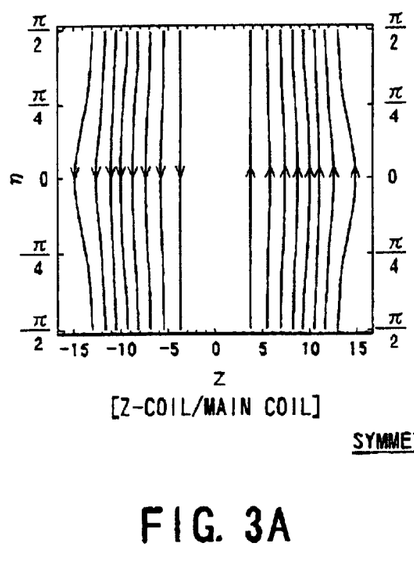
FIGS. 3A and 3B show unrolled views of winding patterns of a symmetric type of z-coil.
Figure 3B:
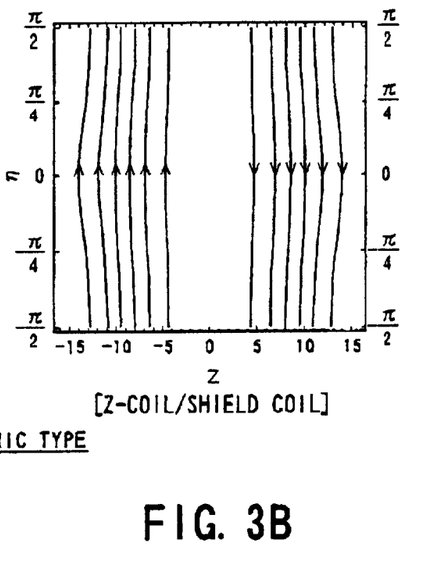
Figure 4A:
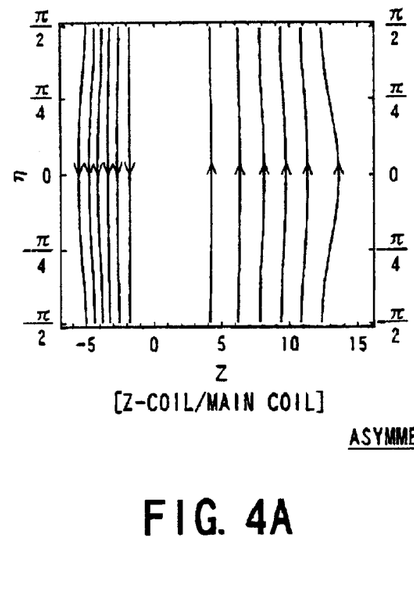
FIGS. 4A and 4B show unrolled views of winding patterns of an asymmetric type of z-coil.
Figure 4B:
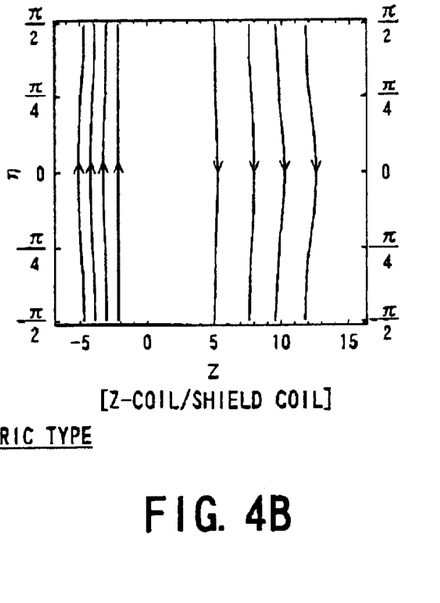

FIGS. 3A and 3B and FIGS. 4A and 4B exemplify winding patterns of the Z-coil (coil winding parts). of these, FIGS. 3A and 3B show winding patterns (½-unrolled view) of the Z-coil of a symmetric type of elliptic cylindrical ASGC of which windings are symmetric with regard to the Z-axis direction. By contrast, FIGS. 4A and 4B show winding patterns (½-unrolled view) of the Z-coil of an asymmetric type of elliptic cylindrical ASGC of which windings are asymmetric with regard to the Z-axis direction. FIGS. 3A and 4A show the winding patterns of the main coils, while FIGS. 3B and 4B show the winding patterns of the shield coils.

The X-coil 12X includes, although not shown, a main coil and a shield coil each of which consists of for example a flat conductor and each coil has four saddle-type of winding patterns (winding parts) wound around a bobbin. In other words, in each of the main coil and the shield coil, two saddle-type of winding patterns arranged in the Z-axis direction and electrically connected in series are arranged face to face in the X-axis direction so as to form two sets of winding patterns. A total of eight winding parts in both the main coil and the shield coil are electrically connected in series and connected to, for example, a common gradient power supply. This connection is made to establish a current path that allows current to flow through the main and shield coils in mutually opposite ways. These current flows make it possible that magnetic field gradients are created linearly in the X-axis direction with the shield function maintained.

Figure 5A:
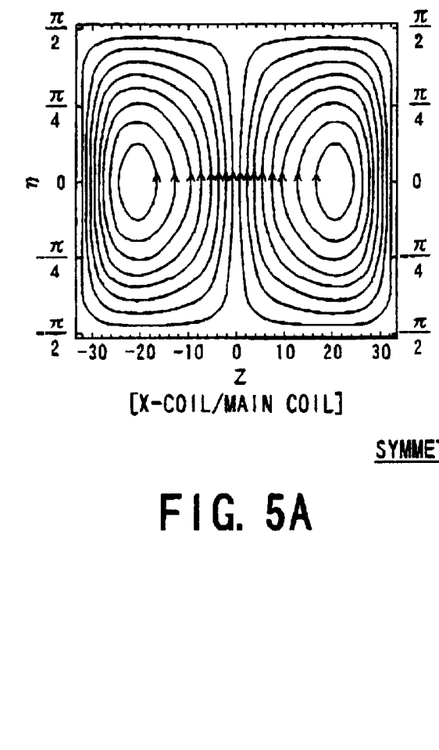
FIGS. 5A and 5B show unrolled views of winding patterns of a symmetric type of x-coil.
Figure 5B:
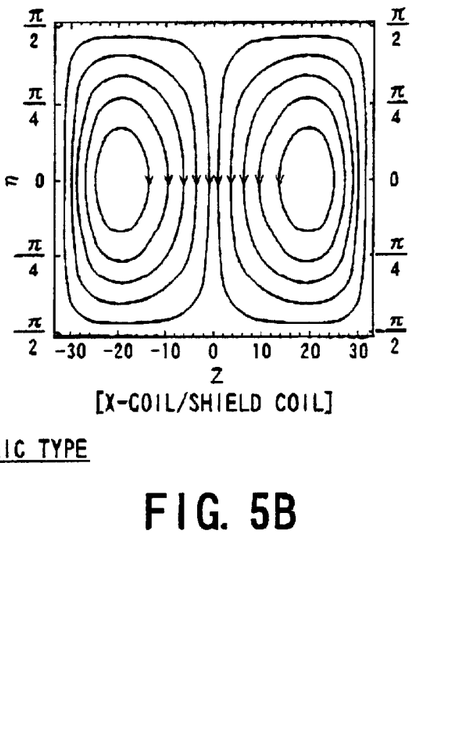
Figure 6A:
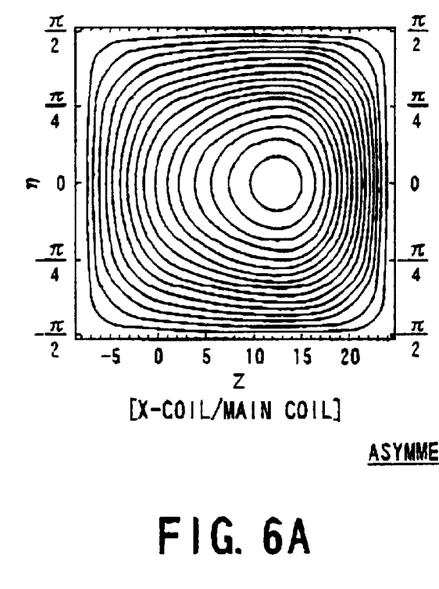
FIGS. 6A and 6B show unrolled views of winding patterns of an asymmetric type of x-coil.
Figure 6B:
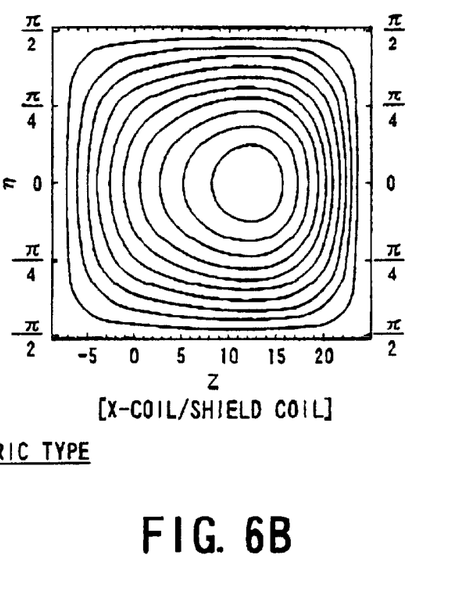

FIGS. 5A and 5B and FIGS. 6A and 6B show examples of the winding patterns of the X-coil. Of these examples, FIGS. 5A and 5B illustrate winding patterns of the X-coil of a symmetric type of elliptic cylindrical ASGC (½-unrolled view), while FIGS. 6A and 6B illustrate those of an asymmetric type of elliptic cylindrical ASGC (½-unrolled view). In addition, FIGS. 5A and 6A show the winding patterns of the main coil, while FIGS. 5B and 6B show those of the shield coil. The winding positions of the wires are analytically obtained on a desired distribution of magnetic flux.

The Y-coil 12Y employs winding patterns similar to those of the X-coil 12X, in which the winding patterns are arranged as if those for the X-coils 12X are rotated about the Z-axis.

Though the foregoing Z-coil, X-coil and Y-coil have the winding patterns similar to those of the conventional cylindrical ASGC, spacings between winding positions of the wires are designed differently from the conventional in that, as will be described later, the wires are arranged around an elliptic cylindrical surface so as to obtain a magnetic field performance required for magnetic resonance imaging.

Figure 7:
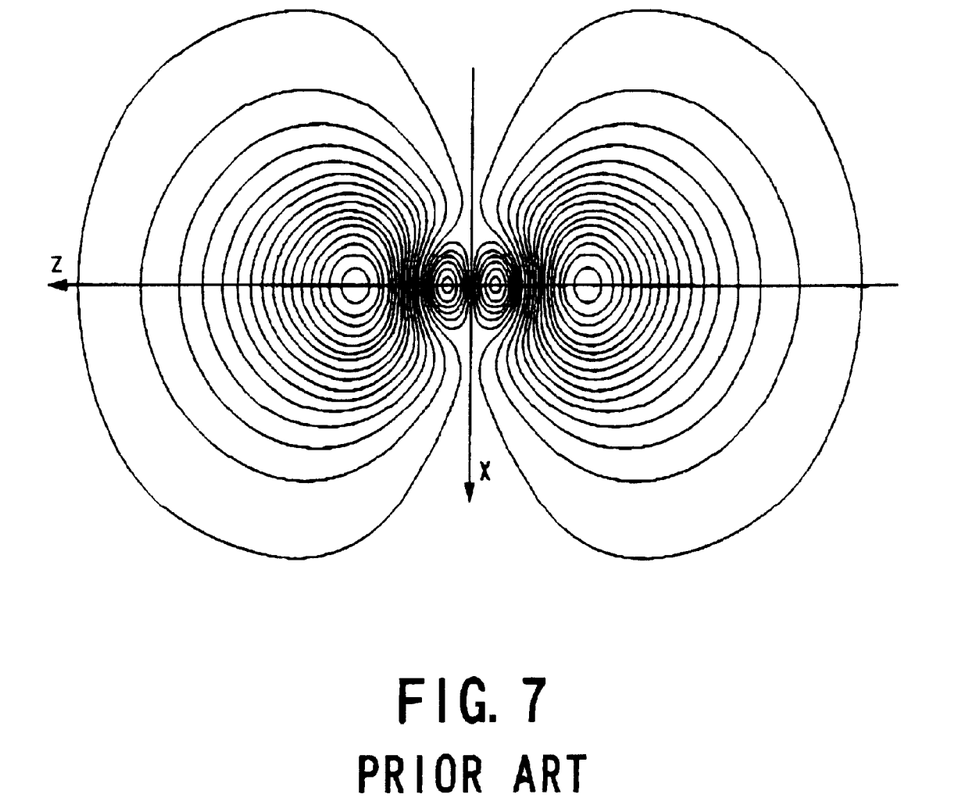
FIG. 7 is a view illustrating winding patterns of a Y-coil of an elliptic cylindrical gradient coil (non-shielded type) which is shown as a prior technique.

As shown in FIG. 7, in the case of a conventionally known elliptic cylindrical gradient coil (non-shield type) disclosed by Japanese Patent Laid-open No. 5-269100, its one coil loop always includes an oppositely-wound loop. Similarly to FIG. 7 showing the Y-coil, each of the X-coil and the Z-coil includes such an oppositely-wound loop. In contrast, for each coil of the elliptic cylindrical ASGC according to the present invention, such an oppositely-wound loop is not necessarily required, with the result that the winding patterns according to the present invention also differs from those of the conventional.

Designing the foregoing elliptic cylindrical ASGC will now be descried in a quantitative manner. In other words, a technique for locating windings of coil wires of the elliptic cylindrical ASGC will now be detailed. The locations of the windings may be determined through processing executed by a host computer in the imaging system 2 or by a universal type of computer (not shown).

Figure 8:
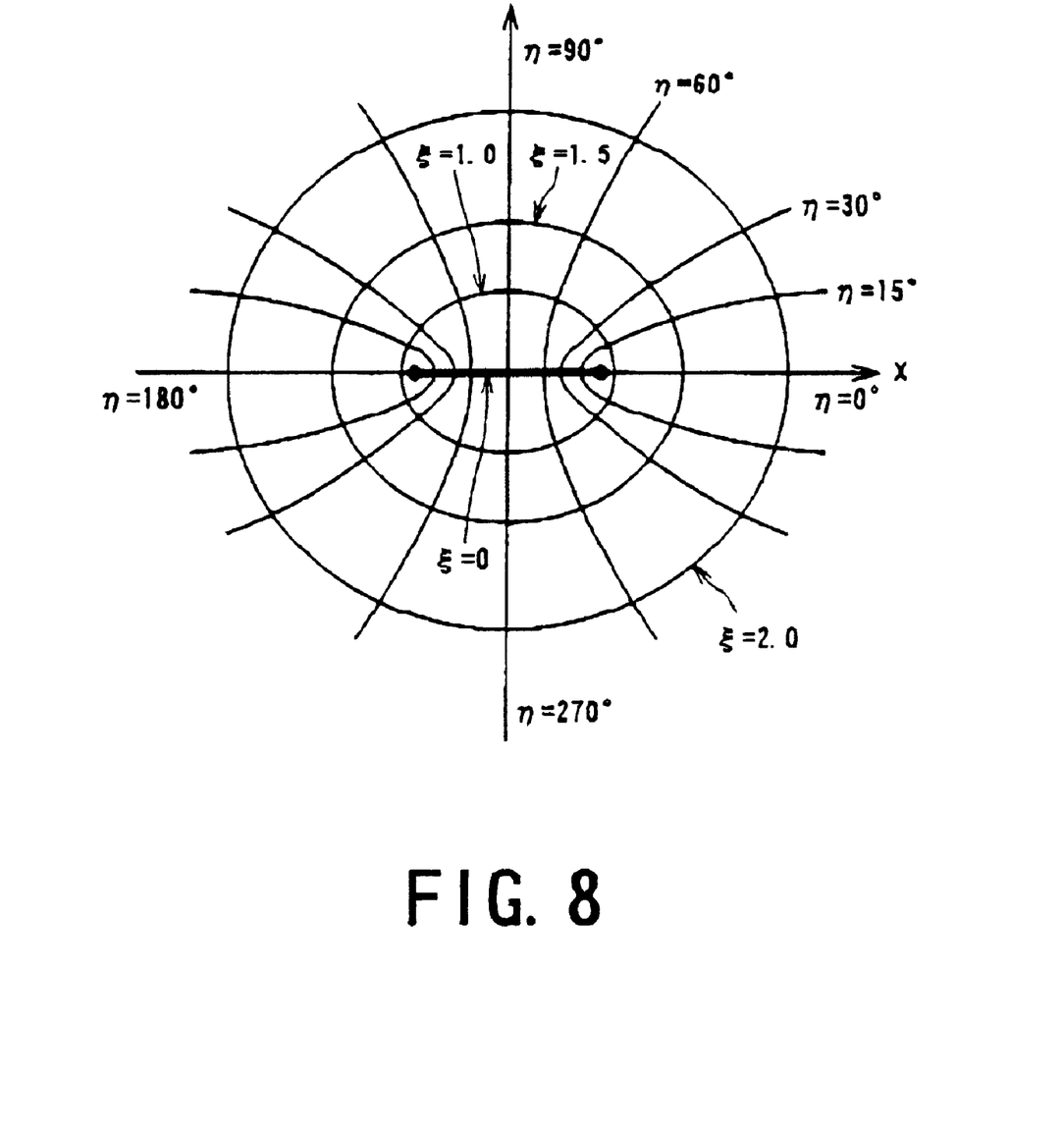
FIG. 8 illustrates an elliptic coordinate.

An elliptic cylindrical surface around which coil wires of the main coil are wound is generally expressed by the following equations (1) that use the elliptic coordinate system (refer to FIG. 8).

$$x = c \cos h\, \xi_s \cos \eta,\ y = c \sin h\, \xi_s \sin \eta \qquad (1),$$

where (±c, 0) shows the coordinates of focuses of the ellipses. Further, an elliptic cylindrical surface around which the coil wires of the shield coil are wound can be expressed by the following equations (2) in the similar manner to the above.

$$x = c \cos h\, \xi_s \cos \eta,\ y = c \sin h\, \xi_s \sin \eta \qquad (2)$$

Incidentally, the main coil has the same focuses as those for the shield coil.

The following description will explain how to determine winding positions of coil wires of the shield coil under the condition that the winding positions of wires of the main coils are given.

A η-directional current density function $j_\eta (\eta, Z)$ indicative of the wires of the main coil can be expressed by the following equation (3).

$$j_\eta(\eta, z) = \frac{1}{\pi} \int_{-\infty}^{\infty} dk e^{iks} \left[ \sum_{n=0}^{\infty} j_\eta^{c,n}(k) c\theta_n(\eta) + \sum_{n=1}^{\infty} j_\eta^{s,n}(k) s\theta_n(\eta) \right] \qquad (3)$$

In cases a η-directional current density function for the shield coil is written by $$j_\eta(\eta, z) = \frac{1}{\pi} \int_{-\infty}^{\infty} dk e^{iks} \left[ \sum_{n=0}^{\infty} J_\eta^{c,n}(k) ce_n(\eta) + \sum_{n=1}^{\infty} j_\eta^{s,n}(k) se_n(\eta) \right] \qquad (4)$$

the relationships of $$J_\eta^{c,n}(k) = -\frac{\phi_n^c(k, \xi_c, \xi_s)}{\Phi_n^c(k, \xi_s)} j_\eta^{c,n}(k)$$
$$J_\eta^{s,n}(k) = -\frac{\phi_n^s(k, \xi_c, \xi_s)}{\Phi_n^s(k, \xi_s)} j_\eta^{s,n}(k)$$
(5)

is accomplished, because the gradient coil is formed into the ASGC. Hence the current density function for the shield coil can be calculated. Calculating equations (3) and (5) enables current density in the circumferential direction of each of the main coil and the shield coil to be expressed by weighted even functions and weighted odd functions. And ratios between weights for the shield coil and weights for the main coil are determined with the number of waves in the coil axial direction and a flatness rate of the ellipse.

After calculating the current density function, a stream function is calculated on the current density function by a known technique, as will be described later. Based on the stream function, discrete winding positions of wires of the shield coil are determined. These relationships can be applied to all the X-, Y- and Z-coils as well.

All the terms in the relationships shown by the equations (5) can be written as follows, using Mathieu functions.

$$\phi_n^c(k, \xi_c, \xi_s) = \sum_{\substack{m=1 \\ (n+m:\text{even})}} \left[ Se_m(\xi_c, -q) Gek_m(\xi_s, -q)(M_m^s)^{-2} v_n^m v \sum_m j + \right.$$
$$\frac{c^2 k^2}{\pi^2} \{Ce_{m-1}(\xi_c, -q) Fek_{m-1}(\xi_s, -q)(M_{m-1}^c)^{-2} \sinh\xi_c \sinh\xi_s \alpha_n^{c,m-1} \alpha_{\Sigma j}^{c,m-1} +$$
$$\left. Se_m(\xi_c, -q) Gek_m(\xi_s, -q)(M_m^c)^{-2} \cosh\xi_c \cosh\xi_s \beta_n^{s,m} \beta_{\Sigma j}^{s,m} \}\right]$$

$$\Phi_n^c(k, \xi_s) = \sum_{\substack{m=1 \\ (n+m:\text{even})}} \left[ Se_m(\xi_s, -q) Gek_m(\xi_s, -q)(M_m^s)^{-2} v_n^m v \sum_m j + \right.$$
$$\frac{c^2 k^2}{\pi^2} \{Ce_{m-1}(\xi_s, -q) Fek_{m-1}(\xi_s, -q)(M_{m-1}^c)^{-2} \sinh^2\xi_s \alpha_n^{c,m-1} \alpha_{\Sigma j}^{c,m-1} +$$
$$\left. Se_m(\xi_s, -q) Gek_m(\xi_s, -q)(M_m^c)^{-2} \cosh^2\xi_s \beta_n^{s,m} \beta_{\Sigma j}^{s,m} \}\right]$$
(6)

$$\phi_n^s(k, \xi_c, \xi_s) = \sum_{\substack{m=1 \\ (n+m:\text{even})}} \left[ Ce_m(\xi_c, -q) Fek_m(\xi_s, -q)(M_m^c)^{-2} v_n^m v \sum_m j + \right.$$
$$\frac{c^2 k^2}{\pi^2} \{Se_{m+1}(\xi_s, -q) Gek_m(\xi_s, -q)(M_{m+1}^c)^{-2} \sinh\xi_c \sinh\xi_s \alpha_n^{c,m-1} \alpha_{\Sigma j}^{c,m-1} +$$
$$\left. Ce_m(\xi_c, -q) Fek_m(\xi_s, -q)(M_m^c)^{-2} \cosh\xi_c \cosh\xi_s \beta_n^{s,m} \beta_{\Sigma j}^{s,m} \}\right]$$

$$\Phi_n^s(k, \xi_s) = \sum_{\substack{m=1 \\ (n+m:\text{even})}} \left[ Ce_m(\xi_s, -q) Fek_m(\xi_s, -q)(M_m^c)^{-2} v_n^m v \sum_m j + \right.$$
$$\frac{c^2 k^2}{\pi^2} \{Se_{m-1}(\xi_s, -q) Gek_{m-1}(\xi_s, -q)(M_{m+1}^c)^{-2} \sinh^2\xi_s \alpha_n^{s,m-1} \alpha_{\Sigma j}^{s,m-1} +$$
$$\left. Ce_m(\xi_s, -q) Fek_m(\xi_s, -q)(M_m^c)^{-2} \cosh^2\xi_s \beta_n^{c,m} \beta_m^c \sum j \}\right]$$
(7)

$$v_m^j = \frac{1}{\pi} \int_0^{2\pi} d\eta \, se_m'(\eta, -q) ce_j(\eta, -q), \quad v_m^{\Sigma j} = \sum_{\substack{j=0 \\ (j+m:\text{even})}}^{\infty} v_m^j$$

$$a_j^{c,m} = \frac{1}{\pi} \int_0^{2\pi} d\eta \cos\eta \, ce_m(\eta, -q) ce_j(\eta, -q), \quad \alpha_{\Sigma j}^{c,m} = \sum_{\substack{j=0 \\ (j+m:\text{even})}}^{\infty} a_j^{c,m}$$

$$\beta_j^{c,m} = \frac{1}{\pi} \int_0^{2\pi} d\eta \sin\eta \, se_m(\eta, -q) ce_j(\eta, -q), \quad \beta_{\Sigma j}^{s,m} = \sum_{\substack{j=0 \\ (j+m:\text{even})}}^{\infty} \beta_j^{c,m}$$

$$v_j^m = \frac{1}{\pi} \int_0^{2\pi} d\eta \, se_l'(\eta, -q) ce_j(\eta, -q), \quad v_{\Sigma j}^m = \sum_{\substack{j=1 \\ (j+m:\text{even})}}^{\infty} v_j^m$$

$$a_j^{c,m} = \frac{1}{\pi} \int_0^{2\pi} d\eta \cos\eta \, ce_m(\eta, -q) se_j(\eta, -q), \quad \alpha_{\Sigma j}^{s,m} = \sum_{\substack{j=0 \\ (j+m:\text{even})}}^{\infty} a_j^{c,m}$$

$$\beta_j^{c,m} = \frac{1}{\pi} \int_0^{2\pi} d\eta \sin\eta \, ce_m(\eta, -q) se_j(\eta, -q), \quad \beta_m^{c,\Sigma j} = \sum_{\substack{j=0 \\ (j+m:\text{even})}}^{\infty} \beta_j^{c,m}$$
(8)

$$\left.\begin{array}{l} M_{2n}^c = (-1)^n ce_{2n}(0,-q)ce_{2n}\left(\frac{\pi}{2},-q\right)[A_0^{(2n)}]^{-1} \\ M_{2n+1}^c = (-1)^{n+1} ce_{2n+1}(0,-q)\frac{\partial ce_{2n+1}}{\partial \eta}\left(\frac{\pi}{2},-q\right)\left[\sqrt{q}\, B_1^{(2n+1)}\right]^{-1} \\ M_{2n+1}^s = (-1)^n \frac{\partial se_{2n+1}}{\partial \eta}(0,-q)se_{2n+1}\left(\frac{\pi}{2},-q\right)\left[\sqrt{q}\, A_1^{(2n+1)}\right]^{-1} \\ M_{2n+2}^s = (-1)^{n+1} \frac{\partial se_{2n+2}}{\partial \eta}(0,-q)\frac{\partial se_{2n+2}}{\partial \eta}\left(\frac{\pi}{2},-q\right)\left[\sqrt{q}\, B_2^{(2n+1)}\right]^{-1} \\ q = \frac{c^2 k^2}{4} \end{array}\right\} \quad (9)$$

Z-components of a magnetic field created by each of the main and shield coils with its inner space are given by the following equation (10).

$$B_z(\xi,\eta,z) = \frac{\mu_0}{\sinh^2\xi + \sin^2\eta} \int_{-\infty}^{\infty} dk\, e^{iks} \left( \sum_{m=0}^{\infty} (Fek_m(\xi_c) u_m^c(k) \sinh\xi_c + \right.$$
$$Fek_m(\xi_s) U_m^c(k) \sinh\xi_s) D_m^c + \sum_{m=0}^{\infty} (Fek_m(\xi_c) u_m^s(k) \cosh\xi_c +$$
$$Fek_m(\xi_s) U_m^s(k) \cosh\xi_s) E_m^c + \sum_{m=1}^{\infty} (Gek_m(\xi_c) v_m^c(k) \sinh\xi_c +$$
$$Gek_m(\xi_s) V_m^c(k) \sinh\xi_s) D_m^s + \sum_{m=1}^{\infty} (Gek_m(\xi_c) v_m^s(k) \cosh\xi_c +$$
$$\left. Gek_m(\xi_s) V_m^s(k) \cosh\xi_s) E_m^s \right) \quad (10)$$

in which $$\left.\begin{array}{l} D_m^c = (M_m^c)^{-2}[\sinh\xi\cos\eta\, ce_m(\eta,-q) Ce_m'(\xi,-q) - \cosh\xi\sin\eta\, ce_m'(\eta,-q) Ce_m(\xi,-q)] \\ E_m^c = (M_m^c)^{-2}[\cosh\xi\sin\eta\, ce_m(\eta,-q) Ce_m'(\xi,-q) + \sinh\xi\cos\eta\, ce_m'(\eta,-q) Ce_m(\xi,-q)] \\ D_m^s = (M_m^s)^{-2}[\sinh\xi\cos\eta\, se_m(\eta,-q) Se_m'(\xi,-q) - \cosh\xi\sin\eta\, se_m'(\eta,-q) Se_m(\xi,-q)] \\ E_m^s = (M_m^s)^{-2}[\cosh\xi\sin\eta\, se_m(\eta,-q) Se_m'(\xi,-q) + \sinh\xi\cos\eta\, se_m'(\eta,-q) Se_m(\xi,-q)] \\ u_m^c(k) = \frac{1}{\pi}\sum_{n=0}^{\infty} \alpha_n^{c,m} j_\eta^{c,n}(k),\; u_m^s(k) = \frac{1}{\pi}\sum_{n=0}^{\infty} \beta_m^{c,n} j_\eta^{s,n}(k) \\ v_m^c(k) = \frac{1}{\pi}\sum_{n=0}^{\infty} \alpha_n^{s,m} j_\eta^{s,n}(k),\; v_m^s(k) = \frac{1}{\pi}\sum_{n=0}^{\infty} \beta_n^{s,m} j_\eta^{c,n}(k) \\ U_m^c(k) = \frac{1}{\pi}\sum_{n=0}^{\infty} \alpha_n^{c,m} J_\eta^{c,n}(k),\; U_m^s(k) = \frac{1}{\pi}\sum_{n=0}^{\infty} \beta_n^{c,m} J_\eta^{s,n}(k) \\ V_m^c(k) = \frac{1}{\pi}\sum_{n=0}^{\infty} \alpha_n^{s,m} J_\eta^{s,n}(k),\; V_m^s(k) = \frac{1}{\pi}\sum_{n=0}^{\infty} \beta_n^{s,m} J_\eta^{c,n}(k) \end{array}\right\} \quad (11)$$

In addition, inductance values Lc, Ls and $L_{ASCC}$ of the main coil, shield coil and ASGC are given by the following equations (12), respectively.

$$L_c = \frac{2\pi\mu_0 c^2}{l^2} \int_{-\infty}^{\infty} dk \left\{ \sum_{m=0}^{\infty} [Ce_m(\xi_c) Fek_m(\xi_c)(M_m^c)^{-2}] \times \right.$$
$$[\sinh^2\xi_c |u_m^c|^2 + \cosh^2\xi_c |u_m^s|^2 + |w_m^c|^2 +$$
$$\sum_{m=1}^{\infty} [Se_m(\xi_c) Gek_m(\xi_c)(M_m^s)^{-2}] \times$$
$$\left. [\sinh^2\xi_c |v_m^c|^2 + \cosh^2\xi_c |v_m^s|^2 + |w_m^s|^2] \right\},$$

in which $$L_s = \frac{2\pi\mu_0 c^2}{l^2} \int_{-\infty}^{\infty} dk \left\{ \sum_{m=0}^{\infty} [Ce_m(\xi_s) Fek_m(\xi_s)(M_m^c)^{-2}] \times \right.$$
$$[\sinh^2\xi_s |U_m^c|^2 + \cosh^2\xi_s |U_m^s|^2 + |W_m^c|^2 +$$
$$\sum_{m=1}^{\infty} [Se_m(\xi_s) Gek_m(\xi_s)(M_m^s)^{-2}] \times$$
$$\left. [\sinh^2\xi_s |V_m^c|^2 + \cosh^2\xi_s |V_m^s|^2 + |W_m^s|^2] \right\}$$

$$L_{ASGC} = L_c - L_s$$

$$L_{ASCC} = L_c - L_s \quad (12)$$

In the above Eq. (12), there are provided $$w_m^c(k) = -\frac{1}{ick}\sum_n v_n^m J_\eta^{s,n} \quad (m:\text{even} \to n:\text{odd}, m:\text{odd} \to n:\text{even})$$

$$w_m^s(k) = \frac{1}{ick}\sum_n v_n^m J_\eta^{c,n} \quad (m:\text{even} \to n:\text{odd}, m:\text{odd} \to n:\text{even})$$

$$W_m^c(k) = -\frac{1}{ick}\sum_n v_n^m J_\eta^{s,n} \quad (m:\text{even} \to n:\text{odd}, m:\text{odd} \to n:\text{even})$$

$$W_m^s(k) = \frac{1}{ick}\sum_n v_n^m J_\eta^{c,n} \quad (m:\text{even} \to n:\text{odd}, m:\text{odd} \to n:\text{even}).$$

(13)

Figure 9:
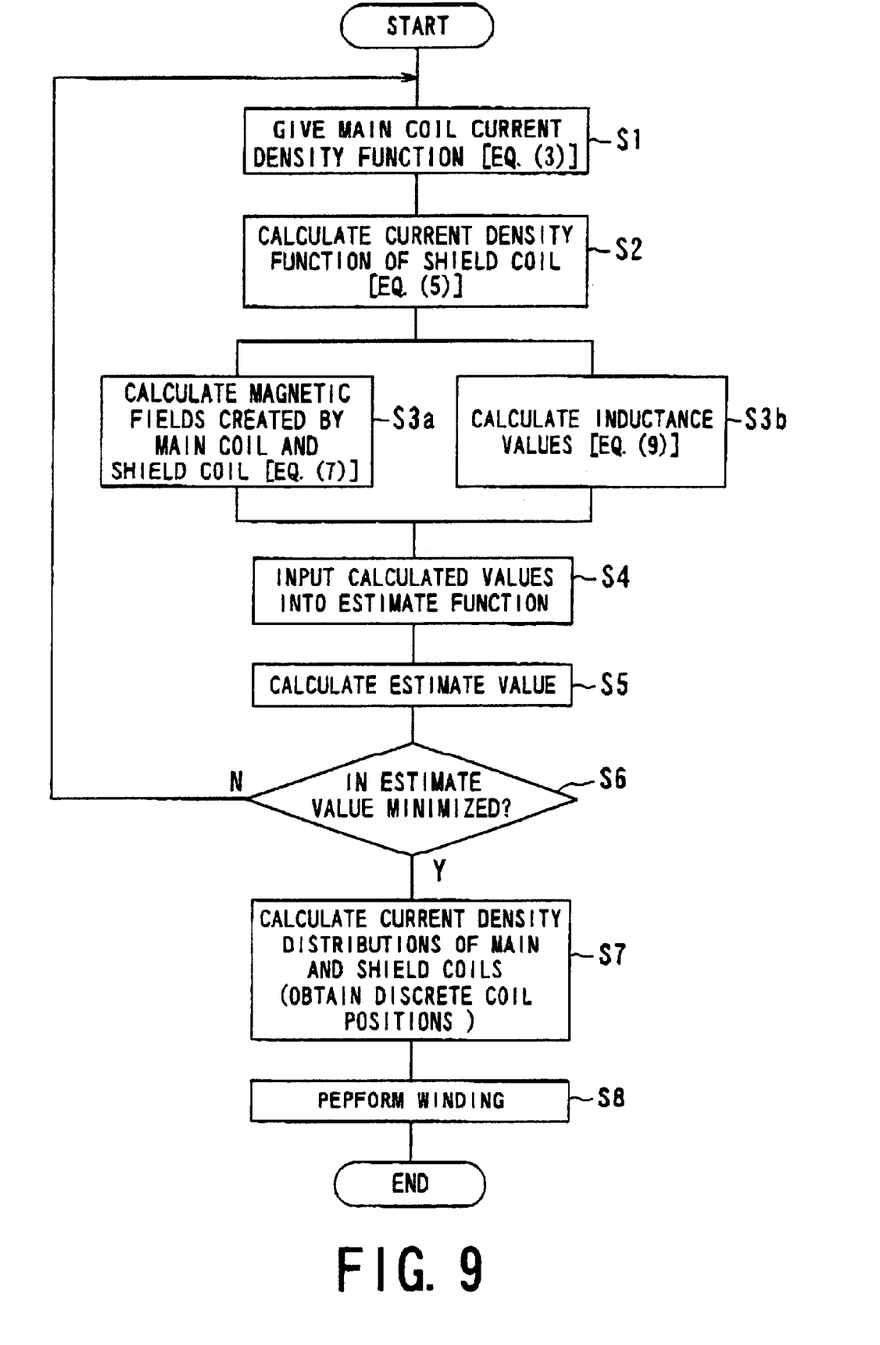
FIG. 9 is an outlined flowchart showing processing necessary for determining winding positions of the coils of the elliptic cylindrical ASGC.

FIG. 9 shows a flow of coil-position determination processing and winding operations for manufacturing the elliptic cylindrical ASGC according to the present invention on the basis of the foregoing qualitative analysis. Practically, first, a current density function is given to the main coil, as shown in equation (3) (step S1), then a current density function of the shield coil that corresponds to that of the main coil is calculated based on equation (5) (step S2). Then, magnetic fields created by the main and shield coils are calculated using equation (7) and inductance values Lc, Ls and $L_{ASGC}$ of the main and shield coils are calculated using equations (7) and (9) (steps S3a and S3b).

These calculated results (the values of the magnetic fields and inductance) are inputted into a specified estimate function (step S4), then an estimate value of the estimate function is calculated (step S5). It is then determined whether or not the estimate value is minimized (step S6). If the determination is NO, the processing is returned to step S1 to alter the current density function. The altered current density function is again subject to processing at steps S2 to S6. In cases where it has been determined at step S6 that the estimate value reaches its minimum (YES), the current density distributions of both the main and shield coils are calculated, and then subjected to processing for obtaining discrete coils' winding positions (step S7). The thus-obtained winding positions are used to wind coil wires around each bobbin (step S9).

In the present embodiment, the processing from steps S1 to S7 is partly or entirely provided as an application program for designing the elliptic cylindrical ASGC. The program is given with a recording medium or transmission recording medium (not shown).

As stated above, to practically design the elliptic in cylindrical ASGC, it is preferable that magnetic gradients be set to their desired intensities, the linearity in the magnetic field which is able to cover an imaging region be secured, and the inductance values be as small as possible. The winding positions of the coil wires are determined on the above qualitative analysis, so that the elliptic cylindrical ASGC can be designed for actual applications. Therefore, characteristics inherently given to the elliptic cylindrical ASGC, that is, higher energy efficiency and the whole-body examination for adults can be attained.

Second Embodiment

Figure 10:
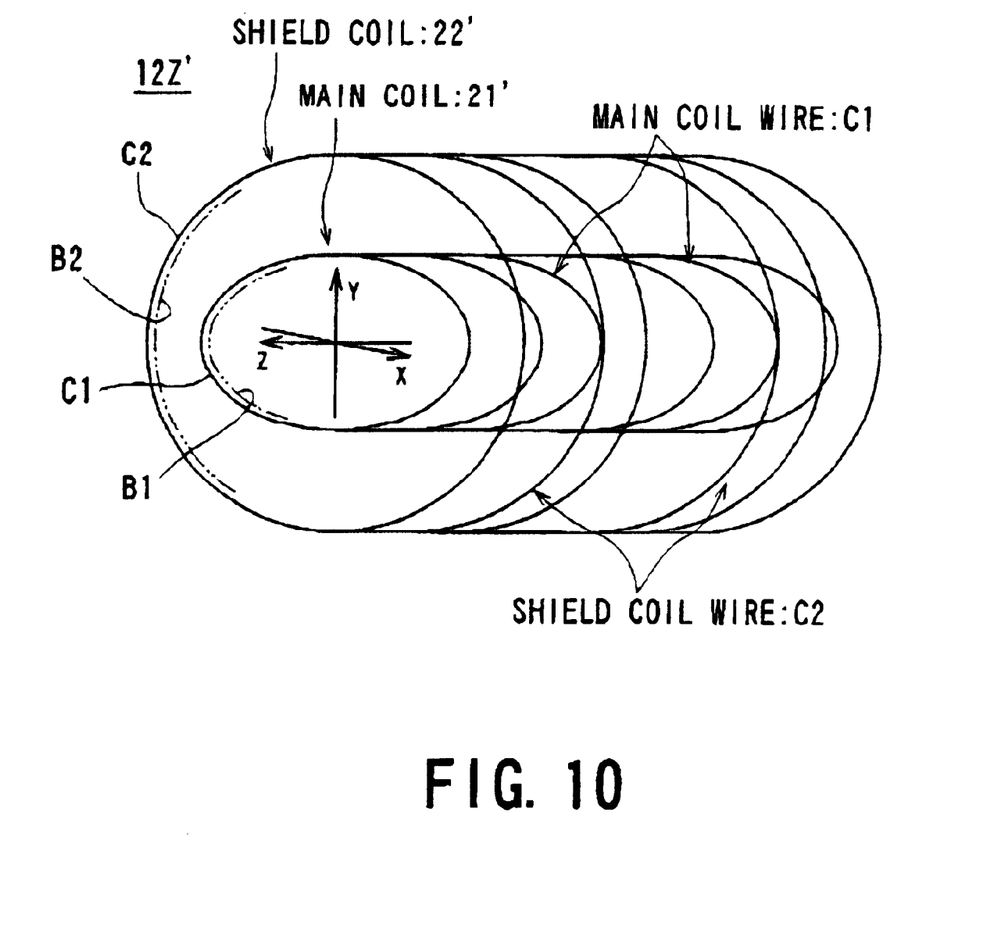
FIG. 10 is a conceptual view illustrating wire arrangement of a Z-coil included in an elliptic cylindrical ASGC according to a second embodiment.

FIG. 10 shows a Z-coil 12Z' of an elliptic cylindrical ASGC according to the second embodiment, and corresponds to the coil structure shown in FIG. 2. The Z-coil 12Z' has a main coil 21' whose section perpendicular to its axial direction is almost elliptic and a shield coil 22' arranged outside the main coil and whose section perpendicular to its axial direction is approximately circular. Namely, while the main coil 21' is still kept in an elliptic cylinder shape, the shield coil 22' is shaped into a cylinder. This arrangement reduces the number of windings to the same magnetic gradient intensities and linearity in the magnetic field as those in the ASGC according to the first embodiment, thereby lowering the inductance values.

In the second embodiment, the ASGC coil is designed such that a current density function is given to the main coil, and a current density function of the shield coil corresponding to that of the main coil is calculated based on known techniques such as a finite element method. The current density function of the shield coil obtained is then expressed by superposition of analytic formulas. Weight coefficients of those analytic formulas are specified as values dependent on the major axis, minor axis, and axis length, and a coil radius of the shield coil. The weight coefficients are given as known values, then inductance values and a magnetic field to the ASGC are calculated using equations that express inductance values and a magnetic field to a cylindrical coil. This provides an elliptic cylindrical ASGC of which main coil is shaped into an elliptic cylinder alone, with the ASGC having desired magnetic gradient intensities and a desired linearity in the magnetic field.

The present invention is not necessarily limited to the configurations described in the above embodiments, but the ASGC according to the present invention is able to employ other various configurations derived from the specification and the appended claims.

What is claimed is:

1. A gradient coil for MRI comprising:

a first coil formed into an elliptic cylindrical shape; and a second coil, which is disposed coaxially to the first coil, having a coil wire positioned so as to cancel a magnetic field created in a spacing outside the second coil, wherein a current density in a circumferential direction of each of the first and second coils is expressed by both of weighted even functions and weighted odd functions, ratios between weights for the second coil and weights for the first coil are determined by values based on the number of waves in a coil-axis direction and a flatness rate of an ellipse, and wound positions of the coil wire of the second coil are determined based on the values.

2. The gradient coil for MRI according to claim 1, wherein the second coil is located outside the first coil in a radial direction of the first coil.

3. The gradient coil for MRI according to claim 1, wherein the second coil is formed into an elliptic cylindrical coil and an elliptic cylindrical outer plane of the second coil and an elliptic cylindrical outer plane of the first coil possess in common a focus located at approximately the same position.

4. The gradient coil for MRI according to claim 1, wherein the second coil consists of a cylindrical coil.

5. A magnetic resonance imaging (MRI) system comprising a gradient coil for applying pulsed magnetic gradients to an object placed in a static magnetic field in order to perform magnetic resonance imaging of the object, the gradient coil comprising:

a first coil formed into an elliptic cylinder shape; and a second coil, which is disposed coaxially to the first coil, having a coil wire positioned so as to cancel a magnetic field created in a spacing outside the second coil by the first coil, wherein a current density in a circumferential direction of each of the first and second coils is expressed by both of weighted even functions and weighted odd functions, ratios between weights for the second coil and weights for the first coil are determined by values based on the number of waves in a coil-axis direction and a flatness rate of an ellipse, and wound positions of the coil wire of the second coil are determined based on the values.

6. A method of designing a gradient coil used for magnetic resonance imaging (MRI) and provided with both of a first coil formed into an elliptic cylinder shape and a second coil arranged coaxially to the first coil, comprising the steps of:

expressing a current density in a circumferential direction of each of the first and second coils by using both of weighted even functions and weighted odd functions, first determining ratios between weights for the second coil and weights for the first coil by using values based on the number of waves in a coil-axis direction and a flatness rate of an ellipse; and second determining wound positions of the coil wire of the second coil based on the values, thereby a magnetic field created in a spacing outside the second coil by the first coil being cancelled.

7. The method of designing the gradient coil according to claim 6, wherein the second coil consists of an elliptic cylindrical coil and an elliptic cylindrical outer plane of the second coil and an elliptic cylindrical outer plane of the first coil possess in common a focus located at approximately the same position.

8. The method of designing the gradient coil according to claim 6, wherein the second coil consists of a cylindrical coil.

9. A computer-readable program for functionally realizing the steps of:

expressing a current density in a circumferential direction of each of first and second coils by using both of weighted even functions and weighted odd functions, the first coil formed into an elliptic cylinder shape, and a second coil arranged coaxially to the first coil, the first and second coils being included into a gradient coil used for magnetic resonance imaging;

first determining ratios between weights for the second coil and weights for the first coil by using values based on the number of waves in a coil-axis direction and a flatness rate of an ellipse; and second determining wound positions of the coil wire of the second coil based on the values, thereby a magnetic field created in a spacing outside the second coil by the first coil being cancelled.

* * * * *